United States Patent [19]

Gardner

[11] Patent Number: 4,672,413
[45] Date of Patent: Jun. 9, 1987

[54] BARRIER EMITTER TRANSISTOR

[75] Inventor: Neal F. Gardner, Redondo Beach, Calif.

[73] Assignee: TRW Inc., Redondo Beach, Calif.

[21] Appl. No.: 600,709

[22] Filed: Apr. 16, 1984

[51] Int. Cl.[4] .................. H01L 49/02; H01L 29/161
[52] U.S. Cl. .......................................... 357/6; 357/16; 357/34; 357/88; 357/59
[58] Field of Search ...................... 357/16, 34, 88, 59, 357/6

[56] References Cited

U.S. PATENT DOCUMENTS

| | | | |
|---|---|---|---|
| 3,372,315 | 3/1968 | Hartman | 357/6 |
| 4,062,034 | 12/1977 | Matsushita et al. | 357/59 |
| 4,131,902 | 12/1978 | Kub | 357/6 |
| 4,286,275 | 8/1981 | Heiblum | 357/16 |
| 4,302,763 | 11/1981 | Ohuchi et al. | 357/16 |
| 4,396,931 | 8/1983 | Dumke et al. | 357/16 |

Primary Examiner—Andrew J. James
Assistant Examiner—Jerome Jackson, Jr.
Attorney, Agent, or Firm—Noel F. Heal; Robert M. Wallace

[57] ABSTRACT

A bipolar transistor, and a corresponding method for its fabrication, in which the injection efficiency, and therefore the common emitter current gain, is greatly increased without significant increase in the emitter resistance of the transistor. An emitter tunneling barrier is formed within the emitter region of the transistor, rather than at the junction between emitter and base regions, and the emitter region adjacent to the barrier is heavily doped. The heavy doping of the emitter results in an increased injection efficiency, but the barrier is thin enough to preclude any significant increase in emitter resistance. The disclosed device is a silicon transistor and the barrier material is either silicon dioxide or semi-insulating polycrystalline silicon (SIPOS), sandwiched between emitter layers of heavily doped polycrystalline silicon material.

12 Claims, 4 Drawing Figures

BARRIER EMITTER TRANSISTOR

BACKGROUND OF THE INVENTION

This invention relates generally to biopolar transistors, and more particularly, to silicon pipolar transistors of the type having a tunnel barrier associated with the emitter region. There is a need for bipolar transistors with lower base resistance, both in power transistor applications and in high-frequency transistor applications. A low base resistance generally results in enhanced device performance. Although the base resistance can be easily reduced by increasing the impurity concentration in the base region of the transistor, this will also have the effect of reducing the common emitter current gain, and it is usually desirable to keep the common emitter current gain as high as possible. For a given fabrication technology, the ratio of common emitter current gain to base resistance is practically constant, which means that a lower base resistance can only be achieved at the expense of reduced common emitter current gain.

A barrier emitter transistor makes use of an insulating or semi-insulating barrier associated with the emitter region of the transistor. Majority and minority current carriers, i.e. electrons and holes, are transmitted through the barrier by means of a process described as quantum mechanical tunneling. By inhibiting minority carrier flow a tunneling barrier can be used to improve the injection efficiency, and hence the common emitter current gain, of a transistor. The injection efficiency is the ratio of the set majority-carrier current across the base-emitter junction, to the net minority-carrier current across the same junction. If the injection efficiency is increased, so is the common emitter current gain of the transistor. This increase provides the basis on which tunneling barriers have been used to enhance common emitter current gain of a transistor without significant increase in the base resistance. One group of researchers in this area has recognized that semi-insulating polycrystalline silicon (SIPOS) material may be used as a barrier layer, but it has not been conclusively established that SIPOS consists of tunneling barriers. See T. Matsushita et al., "A Silicon Heterojunction Transistor," Appl. Phys. Lett., Vol. 35, No. 7, October, 1979, pp. 549–50.

The use of emitter tunneling barriers has, however, raised another problem. The presence of the tunneling barrier significantly increases the emitter resistance of the transistor, and this is undesirable from a performance standpoint. Ideally, then, a bipolar transistor structure should provide low base resistance and high common emitter current gain, without significant increase in emitter resistance. In spite of improvements in emitter barrier structures, there is still a need for a transistor having these characteristics. The present invention fulfills this need.

SUMMARY OF THE INVENTION

The present invention resides in a barrier emitter transistor in which the barrier is located within the emitter region, and the emitter region immediately adjacent to the barrier is heavily doped. An extremely high doping concentration of the emitter results in a greatly enhanced injection efficiency, but without substantial increase in the emitter resistance.

There are basically two presently preferred embodiments of the invention. In one embodiment, a bipolar transistor comprises a conventional semiconductor structure of collector and base regions, and an emitter region having a tunneling barrier of silicon dioxide sandwiched between two heavily doped layers of polycrystalline silicon material, frequently referred to as "poly." The other embodiment also has conventional collector and base regions, but has an emitter that includes a barrier of heavily doped semi-insulating polycrystalline silicon (SIPOS) material sandwiched between poly layers. Both of the poly layers should also be heavily doped.

In the illustrative embodiment of the invention, the transistor is of the npn type. The collector region is of n type silicon, the base is of p type silicon, and the emitter is of n type material, heavily doped and with the tunneling barrier disposed within the emitter.

It will be appreciated from the foregoing that the present invention represents a significant advance in the field of bipolar transistors. In particular, the invention provides a bipolar transistor with increased injection efficiency, but without a corresponding increase in emitter resistance. Other aspects and advantages of the invention will become apparent from the following more detailed description, taken in conjunction with the accompanying drawings.

DESCRIPTION OF THE PREFERRED EMBODIMENT

Figure 1:
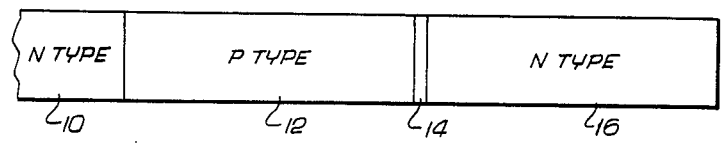
FIG. 1 is fragmentary cross-sectional view of an npn transistor having a tunneling barrier at the junction between the emitter and base regions.

As shown in the drawings for purposes of illustration, the present invention is concerned with an improved bipolar transistor structure employing a tunneling barrier. FIG. 1 shows a fragmentary semiconductor structure as including a collector region, indicated by reference numeral 10, and a base region 12 formed over the collector region. The collector region 10 is of n type silicon material, and the base region 12 is of p type silicon. Both regions are formed by conventional semiconductor fabrication techniques, such as epitaxial processes.

In the structure shown in FIG. 1, a tunneling barrier 14 is formed over the base, and an emitter region 16 is formed over the barrier. The barrier 14 is of insulating material, such as silicon dioxide, and impedes the mobility of both electron current carriers and holes current carriers through the junction between the base and emitter regions 12 and 16. This structure has the effect of increasing emitter resistance, and in some cases also reducing the injection efficiency of the device.

Figure 2:
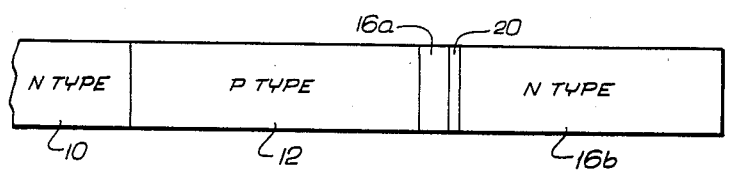
FIG. 2 is a fragmentary cross-sectional view of an npn transistor in accordance with the invention, having a tunneling barrier within the emitter region.

In accordance with the invention, and as shown in FIG. 2, a tunneling barrier layer 20 is positioned within the emitter region 16 rather than at the junction between the base and emitter regions. Furthermore, the portion of the emitter 16 between the barrier 20 and the base 12, indicated at 16a, is heavily doped. The remaining portion 16b of the emitter should also be heavily doped. Any suitable dopant may be used. For the n type material in the illustrative embodiment of the invention, the emitter regions are formed of arsenic-doped or phosphorous-doped polycrystalline silicon. The thickness of the first emitter layer 16a is in the order of 100 angstrom units.

At the end of this specification is a theoretical derivation of the maximum injection efficiencies for the two structures shown in FIGS. 1 and 2. The expressions derived for the injection efficiencies are as follows:

$$v_{1MAX} = \frac{v_n}{v_p} \frac{D_n}{D_p} \frac{n_{0E}}{p_{0B}} \quad (1)$$

$$v_{2MAX} = \frac{v_n}{v_p} \frac{D_n}{D_p} \frac{n_{0E}}{p_{EL}} \quad (2)$$

The quantities n and p in equations (1) and (2) are the electron and hole concentrations. D is a tunneling probability, and v is a quantity having the units of velocity, comparable in value to the mean thermal velocity. Subscripts 1 and 2 refer to the two cases shown in FIGS. 1 and 2, respectively, and subscripts E and B denote the emitter and base regions, respectively. The subscript 0 denotes an equilibrium value. The subscripts n and p denote electrons and holes. Thus, $p_{0B}$ is the equilibrium hole concentration in the base region. The quantity $p_{EL}$ in equation (2) is the total hole concentration in the portion 16a of the emitter to the left of the barrier layer 20.

It will be apparent from equations (1) and (2) that the injection efficiency in both cases may be increased by increasing the concentration of electrons $n_{0E}$ in the emitter region 16. Even more important, however, is the difference between the injection efficiency expressions for the two cases. In the first case, with the barrier at the emitter-base junction, the injection efficiency is inversely proportional to the equilibrium hole concentration in the base region 12. In the second case, with the barrier 20 located within the emitter 16, the injection efficiency is inversely proportional to the total hole concentration in the portion 16a of the emitter between the barrier 20 and the emitter base junction. For the npn transistor illustrated, the hole concentration in the base 12 is normally more than an order of magnitude greater than the injected hole concentration in the emitter 16. Accordingly, if the other corresponding parameters are practically the same in the two cases, the injection efficiency for the FIG. 2 structure will be more than ten times that of the FIG. 1 structure.

The barrier 20 in the FIG. 2 structure is extremely thin, perhaps in the order of ten angstrom units, and its effect on the emitter resistance is not significant, since there are heavily doped n type regions on both sides of the barrier. Electrons can tunnel through the barrier relatively easily, between the two heavily doped n type regions. On the other hand, in the FIG. 1 structure the barrier has a p type region on one side, and only electrons of sufficiently high energy, to overcome the barrier between the emitter conduction band edge and the base conductor band edge, can tunnel between the emitter and base regions.

The injection efficiency for a conventional npn transistor, without an emitter barrier) is given by the expression:

$$v_{CONVENTIONAL} = \frac{W_E}{W_B} \frac{\mu_{nB}}{\mu_{pE}} \frac{n_{0E}}{p_{0B}} \quad (3)$$

In equation (3), $W_E$ is the smaller of the emitter thickness and the hole diffusion length in the emitter; $\mu_{nB}$ is the electron mobility in the base; and $\mu_{pE}$ is the hole mobility in the emitter. In general, the ratios given by the first and second terms of the equation are close to unity. The dominant term is the third one, and it will be recognized that the term is similar to the third term in equation (1), in that the hole concentration term is the equilibrium hole concentration in the base region 12. Therefore, the injection efficiency for the FIG. 2 structure is much larger than that of a conventional npn transistor structure. This is true even when the tunneling probability ratio is close to unity.

The above analysis, using the deriviation given at the end of this specification, is based on the effect of a single barrier layer in the emitter. This would be the effect, for example, if the barrier layer 20 were formed of silicon dioxide. Another embodiment of the invention employs semi-insulating polycrystalline silicon (SIPOS) as the barrier material. The structure of SIPOS has been the subject of discussion in the published technical literature. For example, it has been postulated that undoped SIPOS consists of intrinsic silicon crystals imbedded in a matrix of silicon dioxide. See J. Ni and E. Arnold, "Electrical Conductivity of Semi-Insulating Polycrystalline Silicon and Its Dependence upon Oxygen Content," Appl. Phys. Lett., Vol. 39, No. 7, October, 1981, pp. 554–56.

The observed properties of SIPOS used in heterojunction emitter transistors appear to be better explained by a slightly different model, in which doped SIPOS material consists of heavily doped single crystals of silicon imbedded in a matrix of silicon dioxide. In this model, the SIPOS emitter behaves like a structure consisting of alternating planes of silicon and silicon dioxide. In effect, the SIPOS barrier material behaves like multiple barriers of silicon dioxide interleaved with highly doped planar silicon layers. The silicon planes behave like normal semiconductor materials, and the silicon dioxide planes present quantum mechanical tunneling barriers to both holes and electrons. If the SIPOS barrier is totally within the emitter region 16, the multiple barriers will behave in the same manner as the single barrier layer for which the injection efficiency is expressed in equation (2).

In the SIPOS embodiment of the invention, the SIPOS barrier 20 should be as heavily doped as possible, and should be enclosed between two non-SIPOS layers, such as poly or single-crystal silicon, which should also be heavily doped. One way to achieve this in practice is to deposit on the base region 12 a heavily doped poly layer 16a, followed by a heavily doped SIPOS layer 20, and then followed by a heavily doped poly layer 16b. It is important that the first poly layer 16a be kept much thinner that the minority carrier diffusion length in the poly material. It is also desirable to keep this layer as thin as possible if the speed of the transistor is a consideration, since the layer acts as a charge storage region for minority carriers.

In the energy-band diagrams (FIGS. 3 and 4), conventional labels are used for the various energy levels. $E_c$ is the lowest energy level of the conduction band, $E_v$ is the highest energy level in the valence band, and $E_f$ is the Fermi energy level.

It will be appreciated from the foregoing that the present invention represents a significant advance in the field of bipolar transistors. In particular, the invention provides a bipolar transistor in which the injection efficiency, and therefore the current gain, are greatly increased compared with either conventional bipolar transistors or other emitter barrier transistors. Moreover, this enhanced performance is achieved without any significant increase in emitter resistance. If will also be appreciated that, although the invention has been described in detail for purposes of illustration, various modifications may be made without departing from the spirit and scope of the invention. Accordingly, the invention is not to be limited except as by the appended claims, which follow the derivation of the expressions for injection efficiencies.

Derivation of Injection Efficiencies

This derivation contains a number of simplifications, which, although not significantly affecting the conceptual results derived, should be considered in a more rigorous derivation. Specifically, a more rigorous derivation should consider the following two points.

(1) The tunneling probability is a function of the kinetic energy of particles incident on a tunneling barrier. This is not taken into consideration in the derivation that follows. Rather, the tunneling probabilities given here should be regarded as averaged probabilities.

(2) Band-gap narrowing effects are neglected in the derivation, and Maxwell-Boltzmann statistics are to hold for all cases.

In general, the tunneling current through an energy barrier can be expressed by the following equation:

$$J = gvDn \quad (4)$$

where:
- J = tunneling current density,
- q = charge per charge carrier,
- v = effective average speed per carrier,
- n = number of carriers per unit volume available for tunneling, and
- D = tunneling probability.

The product vn is the number of carriers flowing into the tunneling barrier per unit area per unit time.

Figure 3:
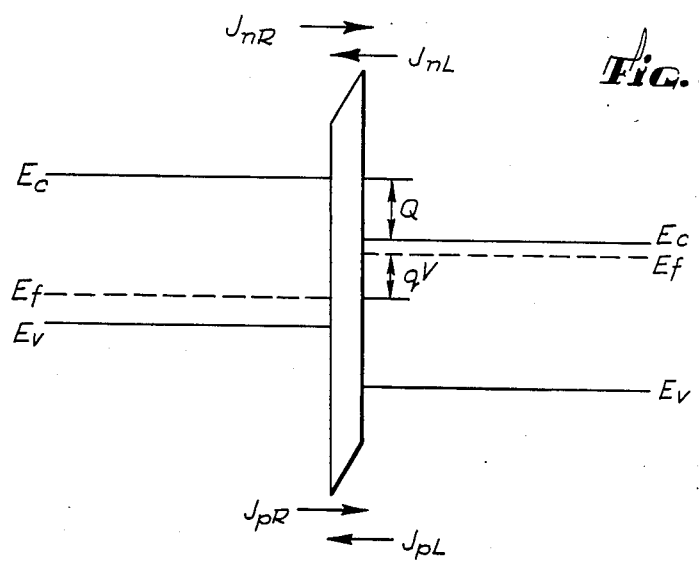
FIG. 3 is an energy-band diagram corresponding to the transistor structure of FIG. 1, also showing the current flows at the barrier.
Figure 4:
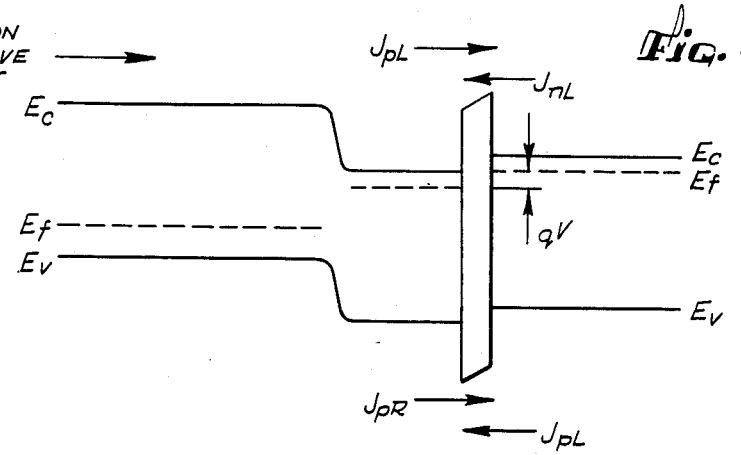
FIG. 4 is an energy-band diagram similar to FIG. 3, but corresponding to the transistor structure of FIG. 2.

Equation (4) will be used for analyzing the two cases shown in FIGS. 3 and 4. The FIG. 3 structure shows a forward-biased, emitter-base region with a tunneling barrier between the emitter and the base. The components of tunneling current are indicated in the figure. The subscripts n and p are used to denote electrons and holes. The subscripts R and L are used to denote rightward and leftward components of current.

Since the direction of electron flux is opposite to the direction of electron current, the rightward component of electron current results from electron flux from the emitter to the base. From equation (4), the rightward component of current density is:

$$J_{nr} = qv_n D_n n_{0E} \exp - \frac{\phi}{kT} \quad (5)$$

The subscript 0 denotes an equilibrium value; the subscript E denotes the emitter. The barrier, $\phi$ between the emitter conduction band edge and the base conduction band edge permits only higher energy electrons to pass through the tunneling barrier. kT represents thermal energy. Therefore, even though the electron density in the emitter region is $n_{0E}$, the density of electrons available for tunneling is $n_{0E} \exp - \phi/kT$.

The substitution, $\phi = \phi_0 - qV$, where V is the voltage across the barrier, can be used in equation (5) to give:

$$J_{nR} = qv_n D_n n_{0E} \exp - \frac{\phi}{kT} \exp \frac{qV}{kT} \quad (6)$$

$\phi_0$ is the height of the barrier between the emitter and base conduction band edges under zero bias conditions. Since $$n_{0E} \exp - \frac{\phi}{kT} = n_{0B}$$

equation (6) may be rewritten in the form:

$$J_{nR} = qv_n D_n n_{0B} \exp \frac{qV}{kT} \quad (7)$$

From equation (4), the electron current from left to right is:

$$J_{nL} = qv_n D_n n_B \quad (8)$$

The net electron current is:

$$J_n = J_{nR} - J_{nL} \quad (9)$$

Inserting expressions (7) and (8) into equation (9) gives:

$$J_n = qv_n D_n \left[ n_{0B} \exp \frac{qV}{kT} - n_B \right] \quad (10)$$

By a derivation similar to the one above, the following equations can be obtained for components of hole current:

$$J_{pR} = qv_p D_p p_{0E} \exp \frac{qV}{kT} \quad (11)$$

$$J_{pL} = qv_p D_p p_E \quad (12)$$

Now if the tunneling barrier is to have a significant enhancing effect on injection efficiency, it is essential that the leftward component of hole current be much smaller than the rightward component of hole current. Otherwise the tunneling barrier would not have a significant impact on the minority carrier distribution; and the concentration gradient of holes in the emitter would be the same without the tunneling barrier. Therefore the hole current may be approximated as only the rightward component of hole current:

$$J_p = J_{pR} = qv_p D_p p_{0E} \exp \frac{qV}{kT} \quad (13)$$

The injection efficiency is:

$$v_1 = J_n/J_p \quad (14)$$

Inserting expressions (10) and (13) into equation (14) gives:

$$v_1 = \frac{v_n}{v_p} \frac{D_n}{D_p} \frac{n_{0B}}{p_{0E}} \left(1 - \frac{n_B}{n_{0B}} \exp - \frac{qV}{kT}\right) \quad (15)$$

Making the substitutions $$n_{0B} = n_i^2 / p_{0B}$$

and $$p_{0E} = n_i^2 / n_{0E}$$

in equation (15) gives $$v_1 = \frac{v_n}{v_p} \frac{D_n}{D_p} \frac{n_{0E}}{p_{0B}} \left(1 - \frac{n_B}{n_{0B}} \exp - \frac{qV}{kT}\right) \quad (16)$$

The maximum injection efficiency occurs when:

$$\frac{n_B}{n_{0B}} \exp - \frac{qV}{kT} << 1$$

In this case equation (16) may be approximated as:

$$v_{1MAX} = \frac{v_n}{v_p} \frac{D_n}{D_p} \frac{n_{0E}}{p_{0B}} \quad (17)$$

The FIG. 4 case shows a forward-biased emitter-base junction with the tunneling barrier located in the emitter. Repeating the foregoing analysis for this case gives the following results:

$$J_n = qv_n D_n n_{0E} \left(1 - \exp - \frac{qV}{kT}\right) \quad (18)$$

$$v_2 = \frac{v_n}{v_p} \frac{D_n}{D_p} \frac{n_{E0}}{p_{EL}} \left(1 - \exp - \frac{qV}{kT}\right) \quad (19)$$

$$v_{2MAX} = \frac{v_n}{v_p} \frac{D_n}{D_p} \frac{n_{E0}}{p_{EL}} \quad (20)$$

$p_{EL}$ is the hole concentration in the emitter to the left of the barrier. Equations (17) and (20) are the same ones reproduced as equations (1) and (2) at the beginning of this description.

I claim:

1. A bipolar transistor having high injection efficiency without significantly increased emitter resistance, said transistor comprising:
   conventionally formed collector and base regions of opposite conductivity types;
   an emitter region of opposite conductivity type to the base region; and
   a tunneling barrier formed within said emitter region;
   wherein a first portion of the emitter region is positioned on one side of said barrier and a second portion of the emitter region is positioned on the other side of said barrier;
   and wherein said emitter region portions adjacent to said tunneling barrier is heavily doped, and whereby the resultant structure yields a greatly improved injection efficiency without significant increase in the emitter resistance.

2. A bipolar transistor as set forth in claim 1, wherein:
   said tunneling barrier is of silicon dioxide; and
   said emitter region adjacent to said tunneling barrier is of heavily doped poly crystalline silicon.

3. A bipolar transistor as set forth in claim 1, wherein: said tunneling barrier is of semi-insulating polycrystalline silicon (SIPOS) material.

4. A bipolar transistor as set forth in claim 1, wherein: said transistor is an open silicon transistor.

5. A bipolar transistor as set forth in claim 2, wherein: said transistor is an npn silicon transistor.

6. A bipolar transistor as set forth in claim 3, wherein: said transistor is an npn silicon transistor.

7. A bipolar silicon transistor having high injection efficiency without significantly increased emitter resistance, said transistor comprising:
   conventionally formed collector and base regions of opposite conductivity types; and
   an emitter region of opposite conductivity type to the base region, said emitter region including
   a first emitter layer of highly doped polycrystalline silicon material formed adjacent to said base region,
   a tunneling barrier formed on said first emitter layer, and
   a second emitter layer formed on said tunneling barrier;
   whereby the resultant structure yields a greatly improved injection efficiency without significant increase in the emitter resistance.

8. A bipolar transistor as set forth in claim 7, wherein: said tunneling barrier is of silicon dioxide material.

9. A bipolar transistor as set forth in claim 7, wherein: said tunneling barrier is of semi-insulating polycrystalline silicon (SIPOS) material.

10. A bipolar transistor as set forth in claim 7, wherein: said transistor is an npn transistor.

11. A bipolar transistor as set forth in claim 8, wherein: said transistor is an npn transistor.

12. A bipolar transistor as set forth in claim 9, wherein: said transistor is an npn transistor.

* * * * *